United States Patent
Chuang

(10) Patent No.: US 6,202,276 B1
(45) Date of Patent: Mar. 20, 2001

(54) PROCESS FOR MANUFACTURING AN ELECTROMAGNETIC INTERFERENCE SHIELDING SUPERPLASTIC ALLOY FOIL CLADDED OUTER SHELL PRODUCT

(76) Inventor: Tung-Han Chuang, No. 5, Lane 18, Wen-Chou St., Taipei (TW)

( * ) Notice: Subject to any disclaimer, the term of this patent is extended or adjusted under 35 U.S.C. 154(b) by 0 days.

(21) Appl. No.: 09/304,027

(22) Filed: May 3, 1999

(30) Foreign Application Priority Data

Dec. 23, 1998 (TW) .................................................. 87121568

(51) Int. Cl.[7] ........................... B23P 17/00; B21D 35/00; B21D 33/00
(52) U.S. Cl. ......................... 29/421.1; 29/469.5; 29/17.3
(58) Field of Search ............................... 29/469.5, 421.1, 29/17.3

(56) References Cited

U.S. PATENT DOCUMENTS

| | | | |
|---|---|---|---|
| 4,767,673 | * 8/1988 | Nakano et al. | 428/458 |
| 4,821,546 | * 4/1989 | Story | 29/421.1 |
| 4,901,552 | * 2/1990 | Ginty et al. | 29/421.1 |
| 5,117,065 | * 5/1992 | Savage et al. | 29/592.1 |
| 5,449,109 | * 9/1995 | Chuang et al. | 29/421.1 |
| 5,531,851 | * 7/1996 | Lin et al. | 156/180 |
| 5,713,178 | * 2/1998 | Sturgill et al. | 52/794.1 |
| 5,746,956 | * 5/1998 | Chuang et al. | 264/104 |
| 5,749,254 | * 5/1998 | Hall, Jr. | 29/421.1 |
| 5,867,370 | * 2/1999 | Masuda | 361/800 |
| 5,974,847 | * 11/1999 | Saunders et al. | 72/57 |

* cited by examiner

Primary Examiner—S. Thomas Hughes
Assistant Examiner—Marc Jimenez
(74) Attorney, Agent, or Firm—Ladas & Parry

(57) ABSTRACT

The present invention provides a process for manufacturing an electromagnetic interference shielding metallic foil cladded plastic outer shell product. A first side of a superplastic alloy foil is coated with an adhesive and then the foil is placed foil in a first half mold to allow the foil to be initially superplastically formed. A second half mold attached to a nozzle of an injection machine is covered onto the first half mold, and the two half molds are closed to further deform superplastic alloy foil. Softened plastic is introduced from the injection machine to a mold cavity between the foil and the second half mold, such that the superplastic alloy foil covered on the first half mold is completely formed and the softened plastic adheres on the adhesive-coated side of the superplastic alloy foil to form an electromagnetic interference shielding metallic foil cladded plastic outer shell product. Two types of products can be obtained, that is, the superplastic alloy foil can be either the outer wall or inner wall. Moreover, the final metallic plastic product can not only have as intricate a shape as an ordinary plastic product, but also a shielding effectiveness as high as an ordinary metallic shield.

16 Claims, 11 Drawing Sheets

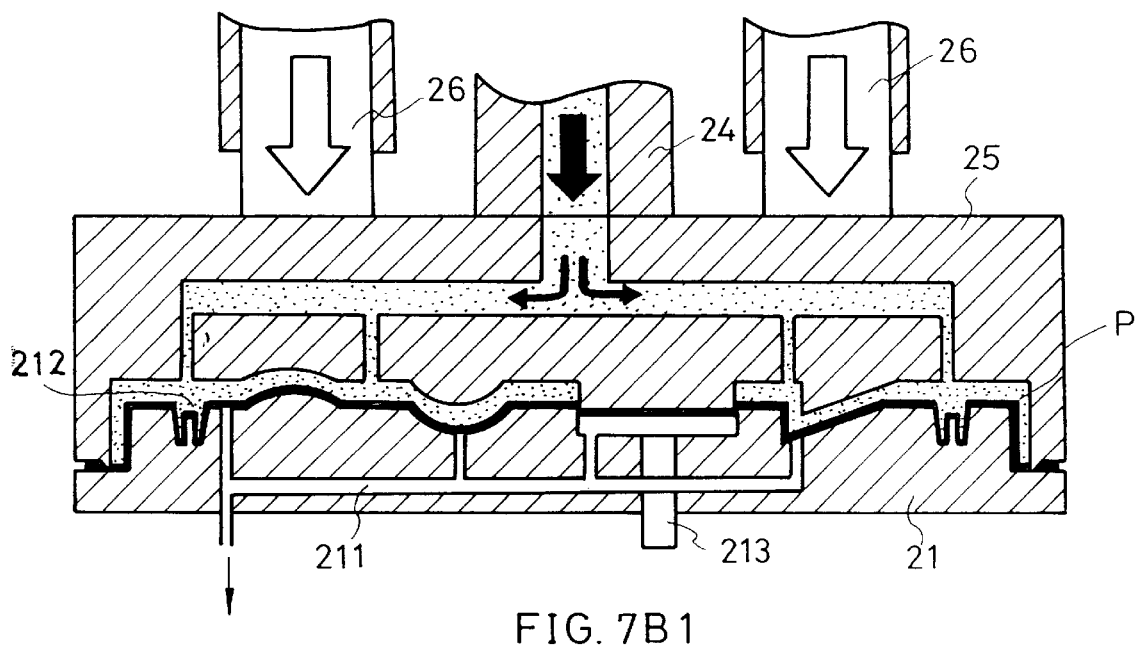
FIG. 7B1

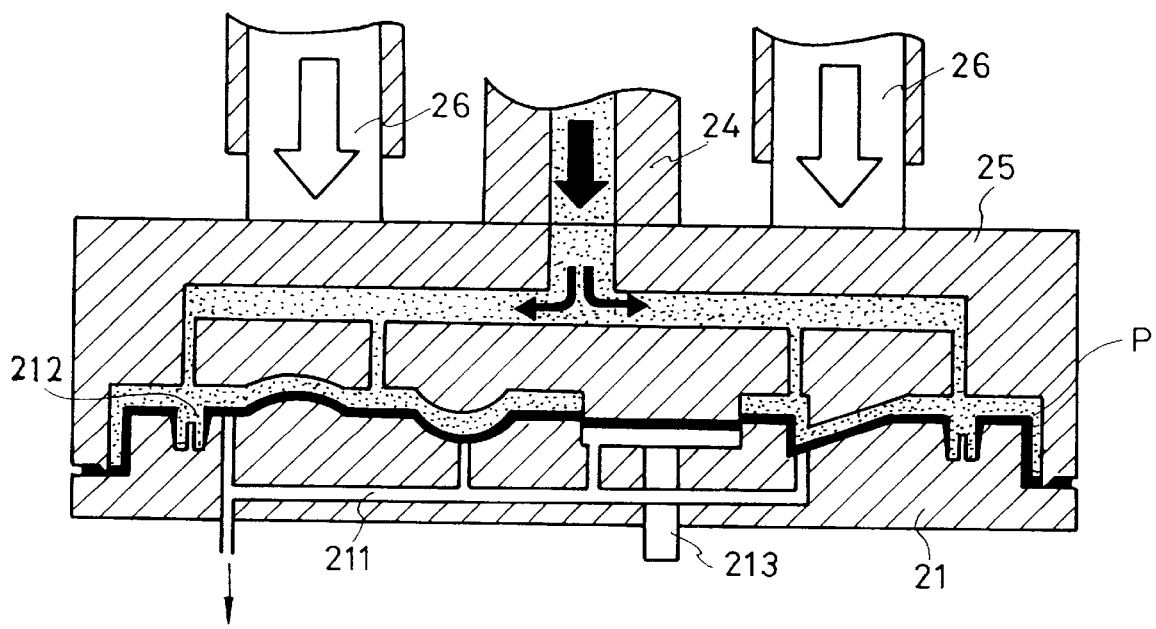
FIG. 7B2

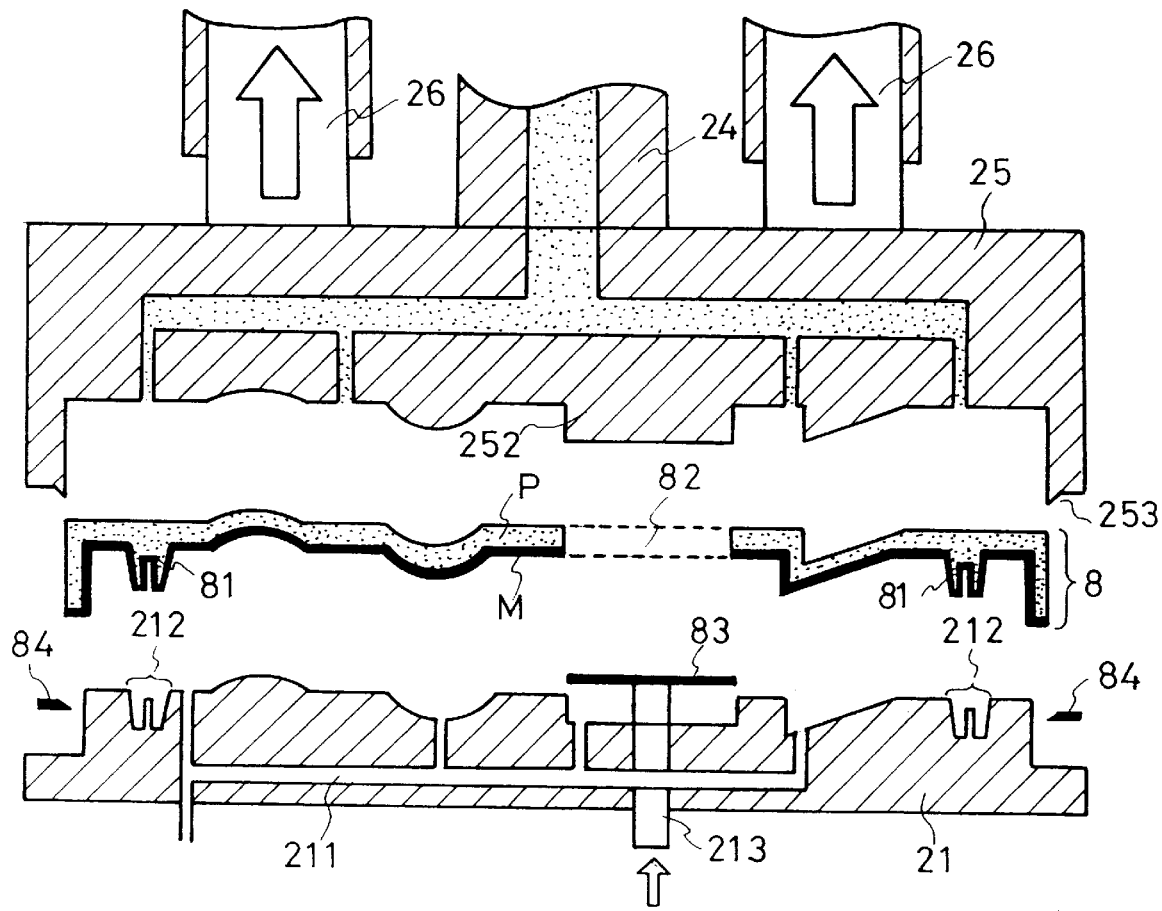
FIG. 8 B1

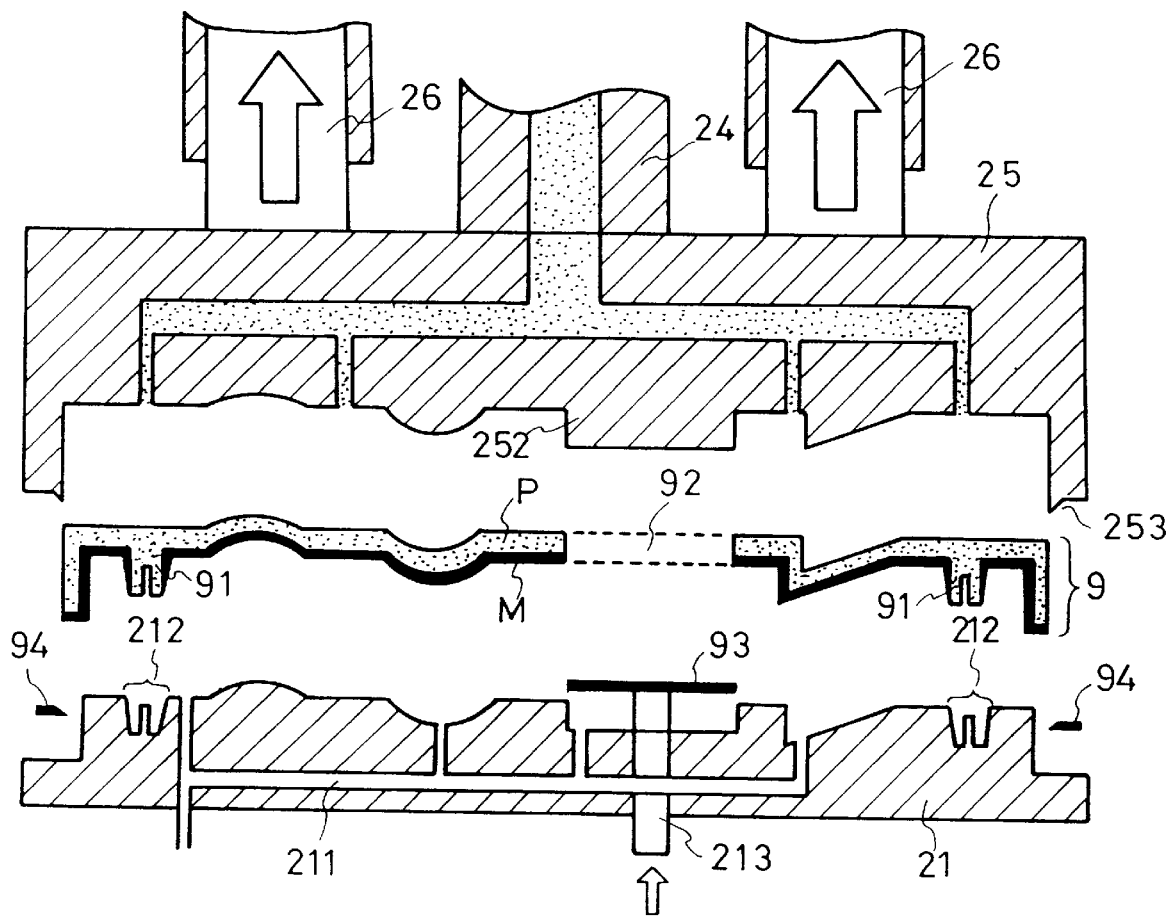
FIG. 8B2

PROCESS FOR MANUFACTURING AN ELECTROMAGNETIC INTERFERENCE SHIELDING SUPERPLASTIC ALLOY FOIL CLADDED OUTER SHELL PRODUCT

BACKGROUND OF THE INVENTION

1. Field of the Invention

The present invention relates to a process for manufacturing an electromagnetic interference shielding metallic foil cladded plastic outer shell product, and more particularly to a process for manufacturing a plastic outer shell product cladded with a superplastic alloy foil as an outer or inner wall by combining two techniques, the superplastic forming of a superplastic alloy and the injecting of softened plastic.

2. Description of the Prior Art

In recent years, advances in technology have led to a dramatic increase in the manufacture and use of sophisticated electronic equipment. However, the highdensity electromagnetic waves produced by electronic equipment can damage or adversely affect the performance of other equipment or components. Also, exposure to electromagnetic waves is harmful to the human body. Therefore, an electrically conductive outer shell is needed to shield electromagnetic interference (EMI) produced by electronic equipment.

Heretofore, various methods have been used to shield electronic equipment. Metallic boxes and cans fabricated from steel, copper, aluminum, etc., were used to surround high EMI emitters as shielding. However, metallic shields with intricate shapes were difficult to fabricate by conventional metalworking methods. Moreover, metallic shields were cumbersome, heavy and costly. Therefore, the electronic industry resorted to metallized plating on plastics. Unfortunately, the results obtained with metallic coatings were not always satisfactory. In addition to being relatively non-economical, once such metallic coatings were scratched through, they would lose part of their shielding efficiency. Unless such conductive coatings are continuous and free of voids, electromagnetic waves will be free to pass through them. Frequently, it was difficult to obtain a dependable, 100% effective coating which was also resistant to peeling.

Further efforts by the electronics industry to develop more dependable light-weight materials for EMI shielding have led to a third approach, namely electrically conductive component-filled plastic composites. It was anticipated that intricate shapes could be molded from the composite materials by conventional means, yielding a finished part more economical and dependable than metal or metal-coated plastics.

The principle factor influencing the performance of conductive component-filled plastic composites is the aspect ratio of the conductive fillers. The aspect ratio is defined as the ratio of the maximum dimension to the minimum dimension of the filler. For example, the aspect ratio of a fiber is the ratio of the length to the diameter of the fiber. According to the electromagnetic wave percolation theory, if the conductive filler in the plastic retains a higher aspect ratio, the filler easily forms a conductive network, and thus, the critical concentration of the conductive filler required to achieve the electromagnetic shielding effect (that is, the threshold percolation concentration) is lower.

The methods for preparing conductive componentfilled plastic composites can be classified into four types. The first type involves compounding the conductive fillers in the form of powders, short fibers or flakes with the plastic matrix, and then having the mixture hot-press molded or injection molded into various kinds of plastic products for shielding EMI.

For example, U.S. Pat. No. 4,474,685 discloses a process for fabricating electromagnetic shielding products by first compounding and then molding a composite including a thermosetting resin binder and an electrically conductive filler (including carbon black, graphite and conductive metal powders). However, during the compounding with the resin matrix, the conductive powders may easily cluster, and thus are not capable of dispersing in the resin matrix. Consequently, the electromagnetic shielding efficiency of the molded products can not be effectively improved. Furthermore, since the powder filler has a lower aspect ratio, according to the electromagnetic wave percolation theory as mentioned above, the amount (i.e., threshold percolation concentration) of the powder filler added must be relatively high to achieve electrical conductivity. Consequently, the mechanical properties, color and other physical and chemical properties of the molded products are adversely affected.

On the other hand, if the conductive filler is in a higher aspect ratio form such as fibers or flakes, the filler can be loaded to a lower level. However, the cluster phenomenon is still difficult to prevent. In addition, during the compounding process, in order to maintain the original aspect ratio, the conductive filler should be strong enough to prevent breakage due to compounding. However, such a strong conductive filler is very expensive, and is thus not suitable for ordinary low cost electronic equipment. More seriously, when the resultant plastic pellets containing such conductive filler with high strength are subjected to injection molding, the mold, screws and compressing cylinder walls of the injection machine will suffer extensive wear.

The second type of method for preparing conductive component-filled plastic composites involves binding a plastic layer to enclose the conductive continuous filler by immersion or extrusion, and then cutting the conductive long fiber-filled plastic stick to a predetermined length. For example, Japanese Patent No. 60-112854 discloses a process including continuous extruding thermoplastic to enclose a copper fiber to form a round copper fiber-filled plastic stick, and then cutting the round plastic stick into pellets of a predetermined size. In order to increase the aspect ratio of the filler, the diameter of the conductive long fiber should be as small as possible. The fibrous filler must be strong enough to prevent breakage. Because the compounding step is omitted in the second method, clustering of the filler is improved. However, again, when the resultant plastic pellets containing a conductive filler with high strength are subjected to injection molding, the mold, screws and compressing cylinder walls of the injection machine will suffer extensive wear.

The third type of method for preparing conductive component-filled plastic composites, disclosed in U.S. Pat. No. 5,531,851 and German Patent DE 19517554C2, involves sandwiching an electrically conductive metal foil in between two plastic films to form a metallized laminated plastic sheet; slicing the plastic sheet into plastic strips; radially arranging the metallized plastic strips into a die of an extruder to be wetted and bound by softened plastic into a metallized plastic bar; and finally cutting the plastic bar into metallized plastic pellets of a predetermined size.

In the third method, the compounding step is omitted, thus clustering of the filler is improved. In addition, the metal foil in the plastic/metal/plastic laminated strips is reinforced by plastic. Therefore, even aluminum foil with lower strength is applicable. Hence, when the resultant plastic pellets are subjected to injection molding, the wearing of the mold, screws and compressing cylinder walls of the injection machine will be lessened. However, in the injection molding step, such aluminum foil with lower strength has a higher possibility of breaking. Therefore, there is a need to use a specially designed injection screw and injection mold.

The above three methods all involve subjecting the conductive pellets to hot-pressing or injection molding to obtain the final plastic article for shielding EMI. When injection molding is employed, in order to prevent lag, segregation, and orientional phenomena from occurring to the metallic filler in the mold, the design of the mold is very critical and complicated, thus increasing costs. Moreover, if a very thin product is desired, such as the outer shell of a notebook computer, the design of the mold is difficult, or even impossible to achieve.

In addition, floating phenomenon in the final conductive plastic article can not be prevented. Therefore, surface plastic coating on the final conductive plastic article is required, thereby increasing cost. Most importantly, according to the above three methods, the conductive filler in the plastic is not continuous (i.e. non-solid). Therefore, the resulting electromagnetic shielding effectiveness of such plastic article is limited to about 50 dB, which is far less than that of a conventional metal outer shell.

The fourth type of method for preparing conductive component-filled plastic composites applies vacuum molding technique. Japanese Patent No. 61-293827 discloses such a method, which involves introducing the molten lead/tin alloy having a low melting point into the space between two molten plastic layers; rolling it to form a plastic/metal/plastic laminated plate; and subjecting the plate to vacuum molding at a temperature higher than the melting point of the metal and the softening point of the plastic to form a predetermined shape. By employing this method, hot-pressed molding and injection molding can be omitted, and production costs can be reduced. The conductive filler inside the plastic is in a continuous form.

However, during the process for manufacturing the plastic/metal/plastic laminated plate in the fourth method, the molten metal and the plastic have different viscosity and strength. Therefore, the thickness ratio of the metal to plastic in the laminated plate is very difficult to control. More seriously, during the vacuum molding process, the metal is in the molten state. Thus it has no bonding to the two plastic plates, and thereby, separation of the laminated plate very easily occurs. Even if the separation does not occur, when the laminated plate is attached to the wall of the mold, the metal is in the molten state and is flowing. Thus, the metal liquid will accumulate at slots, holes or other concave sites of the mold, and the resulting product for shielding EMI will have defects and can even be strongly distorted.

In addition, the metal used in the fourth method has a melting point lower than the softening point of the plastic. This indicates that the final product can only be applied at a temperature lower than the melting point of the metal. Therefore, when the electronic elements including the product obtained from the fourth method are operated and generate heat in some areas, the plastic outer shell and the electronic elements will be destroyed in those areas, causing very severe adverse results.

Another serious problem common in the above four types of methods is that the surface of the metallized plastic product obtained has very little conductive material or even none. Therefore, when multiple sheets of the metallized plastic product are combined to form an outer shell of a notebook computer, cellular phone, or digital camera, there is a continuous non-conductive plastic region at the interface of two metallic plastic sheets. Thus, the combined outer shell suffers a serious wave leak phenomenon and can not achieve the required electromagnetic shielding effectiveness.

Adhering a layer of aluminum foil directly on the plastic surface is a conventional technique to solve the problem of having little conductive material on the surface of the plastic outer shell,. Although this technique is very easy, it is impossible to maintain a complete, continuous aluminum foil on the plastic outer shell of an electronic product having a very intricate shape. Wave leakage occurs on the non-continuous region; thus, the shell can not meet the electromagnetic shielding requirements.

Japanese Patent No. 4-123490 provides another technique for applying a conductive layer onto a plastic outer shell. The process involves coating a 1 $\mu$m to 100 $\mu$m layer of metal having a melting point of 70° C. to 420° C. on the surface of the mold cavity and injecting molten plastic to the mold cavity to allow the plastic to adhere to the metal layer. Although a plastic outer shell with an intricate shape can be obtained, the plastic and the metal layer have poor interfacial adherence, thus forming undesirable voids in the plastic outer shell product.

The compression casting and injection molding of magnesium alloys have drawn increasing interests in recent years. The magnesium alloy outer shell thus produced not only has high electromagnetic shielding effectiveness, but also can have an intricate shape as a plastic product. Moreover, magnesium alloy has a very low density, thus the product manufactured therefrom has the advantage of light weight. However, during the manufacturing process, protective gas should be applied to protect the magnesium alloy from ignition. Moreover, a large amount of pin holes are often present on the compression cast or injection molded product, and the magnesium alloy is easily eroded. Therefore, complicated post treatment must be employed, thus increasing the entire manufacturing cost.

SUMMARY OF THE INVENTION

An object of the present invention is to solve the above-mentioned problems and to provide a process for manufacturing a metallized plastic outer shell product with a shape as intricate as that of an ordinary plastic product, and having the same high shielding effectiveness (higher than 60 dB) as that of an ordinary metallic shield. The metal layer in the final metallized plastic product is very thin; therefore, the final metallized plastic product is as light in weight as an ordinary plastic product. The adherence between metal and plastic is good. The manufacturing process cost is low, and environmental pollution is not a problem.

To achieve the above object, the process for manufacturing an electromagnetic interference shielding metallic foil cladded plastic outer shell product comprises the following sequential steps of:

(a) coating a first side of a superplastic alloy foil with an adhesive;

(b) placing the adhesive-coated superplastic alloy foil in a first half mold with a second side of the foil contacting the first half mold, and heating and applying flow stress to the superplastic alloy foil to allow the foil to superplastically form into a predetermined shape and to allow the foil to cover on the first half mold, whereby the superplastic alloy is initially superplastically formed;

(c) covering a second half mold attached to a nozzle of an injection machine onto the first half mold covered with the foil, and closing the two half molds to further deform the superplastic alloy foil, a mold cavity being formed between the adhesive-coated side of the superplastic alloy foil and the second half mold;

(d) introducing softened plastic from the injection machine via the nozzle to the mold cavity, such that the superplastic alloy foil covered on the first half mold is completely formed and the softened plastic adheres on the adhesive-coated side of the superplastic alloy foil to form an electromagnetic interference shielding metallic foil cladded plastic outer shell product; and (e) removing the plastic outer shell product from the mold.

Further applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, given by way of illustration only and thus not intended to be limitative of the present invention.

FIGS. 1A to 8A show the process flow for manufacturing the plastic outer shell product cladded with a superplastic alloy foil as an outer wall according to the first preferred embodiment of the present invention.

FIGS. 1B to 8B show the process flow for manufacturing the plastic outer shell product cladded with a superplastic alloy foil as an inner wall according to the second preferred embodiment of the present invention, wherein FIGS. 7B1 and 8B1 show the condition when the softened plastic injected does not punch through the superplastic alloy foil adhered on the recess, and FIGS. 7B2 and 8B2 show the condition when the softened plastic injected does punch through the superplastic alloy foil adhered on the recess.

DETAILED DESCRIPTION OF THE PREFERRED EMBODIMENTS

Figure 1A:
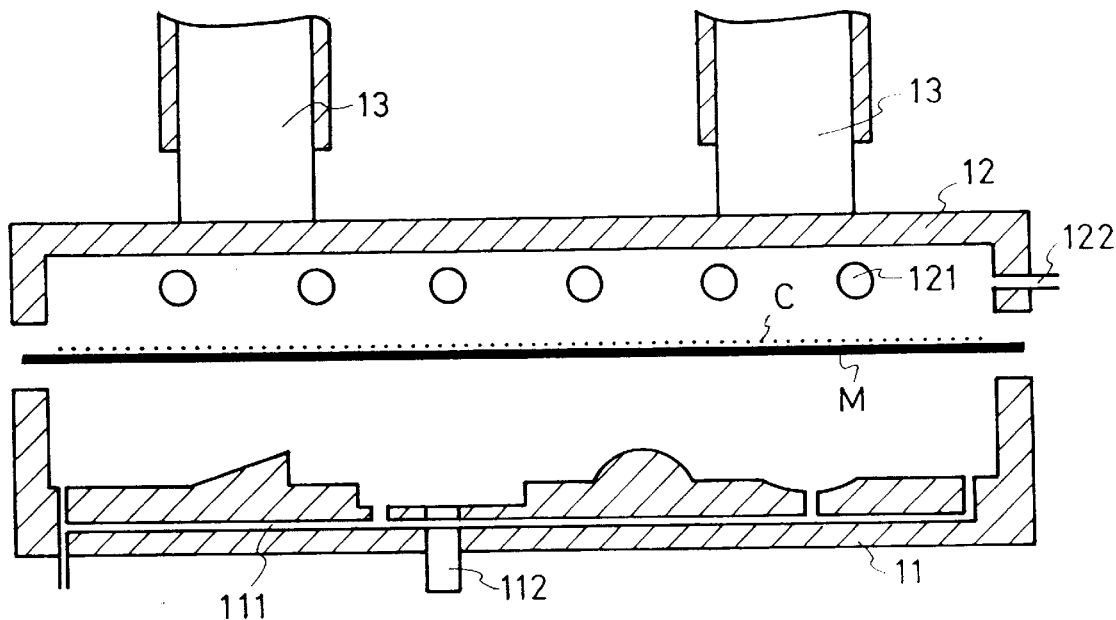

To solve the problems of the conventional process, the inventor has successfully provided a novel process for manufacturing a metallized plastic outer shell product cladded with superplastic alloy foil.

According to the present invention, the process for manufacturing the metallized plastic product uses two techniques, superplastic forming and injection molding.

First, one side of a superplastic alloy foil is coated with an adhesive. Then, the superplastic alloy foil is placed in a first half mold and is superplastically formed initially into a predetermined shape according to the shape of the first half mold. The adhesive-coated side of the foil contacts the first half mold. Then, a second half mold which is attached to a nozzle of an injection machine is closed onto the first half mold covered with the foil to form a mold cavity between the coated side of the foil and the second half mold. Finally, softened plastic is introduced from the injection machine to the mold cavity, such that the softened plastic adheres on the coated side of the foil and the superplastic forming of the foil is complete. Thus, a metallic foil cladded plastic outer shell product is formed.

The so-called "superplastic alloy" is a specific alloy which undergoes very large deformations when a very low strain is applied under specific conditions. The requirements for a superplastic alloy include that: (1) the grain size of the superplastic alloy should be less than 10 $\mu$m; (2) the superplastic alloy is of dual-phase structure; (3) the superplastic alloy is deformed at a temperature that is higher than half of the absolute melting point of the superplastic alloy; and (4) the deformation rate is lower than $10^{-4}$ sec$^{-1}$, though some high rate superplastic alloys have been developed.

More than 200 kinds of superplastic alloys that have been reported or even commercialized, including zinc alloys, aluminum alloys, magnesium alloys, titanium alloys, tin alloys, duplex stainless steels, and super alloys. There is no special limitation for the type of superplastic alloy used in the present invention. However, to save energy, the superplastic alloy chosen preferably has a superplastic deforming temperature close to the softening point of the plastic chosen. Thus, the deforming of the superplastic alloy and the melting of the plastic can be performed in the same temperature range. In addition, for economical reasons, superplastic alloys of low cost are more acceptable because of the decrease in the total production cost. Table 1 lists the properties of some superplastic alloys suitable for use in the present invention; however, suitable superplastic alloys are not limited to this list. The superplastic alloy foil to be used preferably has a thickness of less than 0.1 mm, but is not limited to this.

The adhesive used in the present invention can be a coupling agent or hot melt adhesive. The coupling agents suitable for coating on the superplastic alloy include silanes, titantates, zirconates and aluminates. The hot melt adhesives suitable for coating on the superplastic alloy include polyvinyl acetate, ethylene vinyl acetate copolymers, rosin and Terpene resin. The melting points of these adhesives are consistent with the softening points of plastic materials in the present invention.

The plastic material suitable for use in the present invention may be in the form of a plate or particles. Preferably, the plastic material is a thermoplastic, such as acrylonitrile-butadiene-styrene (ABS), polystyrene (PS), polyphenylene oxide (PPO) and acrylonitrile-butadiene-styrene/polycarbonate (ABS/PC). Table 2 lists the physical and mechanical properties of some frequently used thermoplastics.

The initial superplastic forming of the foil is conducted by both heating and applying flow stress. Applying flow stress to the superplastic alloy foil can be conducted by evacuating a space between the foil and first half mold, by blowing gas into a space between the foil and the second half mold, or by knocking another mold onto the superplastic alloy foil. For example, a negative pressure of 0.05 to 1.00 kg/mm$^2$ can be provided by evacuating a space between the foil and the first half mold, and a positive pressure of 0.05 to 1.00 kg/mm$^2$ can be provided by blowing gas into a space between the foil and the second half mold. The blowing gas can be air or a protective gas such as nitrogen or argon.

TABLE 1

The properties of Some Superplastic Alloys Suitable for Use in the Present Invention

| Properties | Alloy | | | | | | |
|---|---|---|---|---|---|---|---|
| | An-22 Al | Zn-0.1 Ni-0.04 Mg | Sn-9.8 Zn | Sn-38 Pb | Mg-33 Al | Mg-6 Zn-0.5 Zr (Zk60A) | Mg-6 Al-1 Zn (Az61A) |
| Melting Point or Liquid Line (° C.) | 420 | 422 | 198 | 183 | 437 | 525 | 575 |
| Superplastic Temperature Range (° C.) | 20–300 | 75–300 | 20–180 | 20–170 | 82–437 | 230–350 | 230–350 |
| Best Superplastic Temperature Range (° C.) | 200–275 | 100–250 | 120–180 | 80–170 | 300–400 | 270–310 | 270–310 |
| Strain Rate of the Best Superplasticity (sec$^{-1}$) | $10^{-3}$–$10^{-1}$ | $10^{-3}$–$10^{-1}$ | $10^{-3}$–$10^{-1}$ | $10^{-3}$–$10^{-1}$ | $10^{-3}$–$10^{-1}$ | $10^{-3}$–$10^{-1}$ | $10^{-3}$–$10^{-1}$ |
| Rheological Strain of the Best Superplasticity (kg/mm$^2$) | 0.2 | 0.4 | 0.1 | 0.1 | 0.1 | 0.6 | 0.7 |
| Elongation of the Best Superplasticity (%) | 2900 | 980 | 570 | 4850 | 2100 | 1700 | 1700 |
| Strain Sensitivity of Superplasticity (m value) | 0.7 | 0.51 | 0.5 | 0.7 | 0.8 | 0.52 | 0.64 |
| Electric Resistivity ($\mu\Omega \cdot$ cm) | 3.4 | 6.2 | 10.8 | 14.7 | 3.1 | 4.6 | 4.2 |
| Density (g/cm$^3$) | 2.8 | 7.1 | 7.2 | 8.4 | 1.8 | 1.6 | 1.5 |
| Tensile Strength (kg/mm$^2$) | 26.5 | 24.3 | 4.7 | 4.4 | 20.7 | 28.4 | 27.2 |
| Yield Strength (kg/mm2) | 22.5 | 20.4 | 3.2 | 2.5 | 17.5 | 26.3 | 25.4 |
| Room Temperature Elongation (%) | 20 | 17 | 36 | 78 | 22 | 19 | 21 |
| Elastic Coefficient (kg/mm$^2$) | 7300 | 6600 | 4400 | 4300 | 4100 | 4700 | 4500 |
| Impact Value (kg · m/cm$^2$) | 13.7 | 10.8 | 7.1 | 7.0 | 6.5 | 12.2 | 11.9 |
| Coefficient of Thermal Expansion ($10^{-6}$/° C.) | 24.2 | 30.8 | 20.4 | 23.9 | 26.1 | 28.2 | 26.5 |
| Environmental Pollution | None | None | None | Pb pollution | None | None | None |
| Cost (USD/kg) | 5.6 | 4.2 | 7.8 | 7.5 | 10.7 | 12.8 | 12.5 |

TABLE 2

Physical and Mechanical Properties of Some Plastics

| Physical and Mechanical Properties | ABS | PPO | PS | ABS/PC |
|---|---|---|---|---|
| Thermal Deformation Temp (° C.) | 90~108 | 180~204 | 65~96 | 120~124 |
| Softening point (° C.) | 120~160 | 300 | 120~165 | 220~240 |
| Forming Temp (° C.) (in general) | 200~220 | 270~300 | 210~250 | 230~270 |
| Volume Resistivity ($\mu\Omega \cdot$ cm) | $6.9 \times 10^{22}$ | $2.0 \times 10^{23}$ | $>10^{22}$ | $2.9 \times 10^{23}$ |
| Density (g/cm$^3$) | 1.02~1.16 | 1.06~1.07 | 1.04~1.06 | 1.10~1.19 |
| Tensile Strength (kg/mm$^2$) | 3.8~4.5 | 4.9~6.9 | 3.5~6.3 | 4.5~5.3 |
| Elongation (%) | 13~35 | 14~50 | 1.0~2.5 | 40~86 |
| Flexural Strength (kg/mm$^2$) | 6.7~8.0 | 8.4~14 | 6.1~9.8 | 9.0~10.8 |
| Elastic Coefficient of Flexure (kg/mm$^2$) | 250 | 246 | 310 | 329 |
| Izod Impact Value (kg · cm/cm) | 13 | 9.5 | 0.7 | 19 |
| Coefficient of Linear Expansion ($10^{-5}$/° C.) | 6~8 | 5.2~6.6 | 6~8 | 5~7 |
| Cost (US$/kg) | 2.2 | 4.3 | 1.7 | 2.3 |

The process of the present invention will be described in more detail. FIGS. 1A to 8A show the process flow for manufacturing a plastic outer shell product cladded with a superplastic alloy outer wall according to the first preferred embodiment of the present invention. Referring to FIG. 1A, one side of a superplastic alloy foil (M) is coated with a layer of an adhesive (C) (either a coupling agent or a hot melt adhesive). Then, the adhesive-coated superplastic alloy foil is placed in a first half mold (11), with the coated side facing upwardly and the non-coated side contacting the first half mold (11). A heating mold (12) provided with a heater (121) is placed on the first half mold (11). The temperature of the heating mold is set according to Table 3 which outlines the suitable superplastic forming temperatures for various superplastic alloys. Infrared is a preferable heating source because of its high heating rate, but other heating sources can also be used.

Figure 2A:
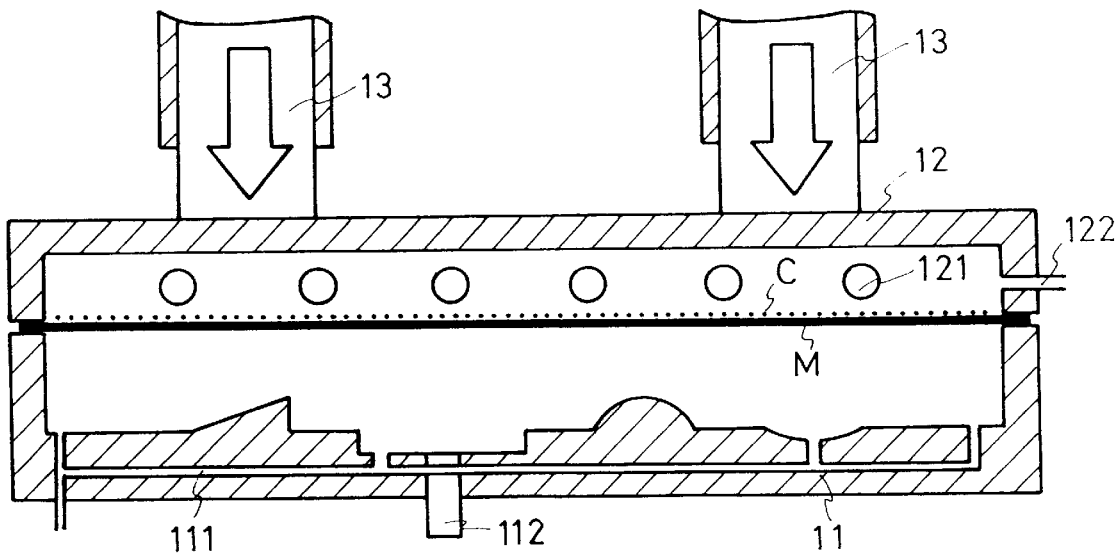

Then, referring to FIG. 2A, the adhesive-coated superplastic alloy foil (M) is fixed between the first half mold (11) and the heating mold (12) by using a first oil pressure rod (13). Then, referring to FIG. 3A, the space between the superplastic alloy foil (M) and the first half mold (11) is evacuated via a vent line (111) provided on the bottom of the first half mold (11), thus providing a negative pressure of about 0.05 to 1.00 kg/mm$^2$. In order to better deform the superplastic alloy foil (M), gas can be blown into the space between the superplastic alloy foil (M) and the heating mold (12) via a gas inlet (122) at the same time of evacuating, thus providing a positive pressure of about 0.05 to 1.00 kg/mm$^2$. By means of the above evacuation and blowing of gas, the superplastic alloy foil (M) can be initially superplastically formed. At this time, the superplastic alloy is only deformed into a general shape, while the finally desired shape has not been achieved.

Figure 4A:
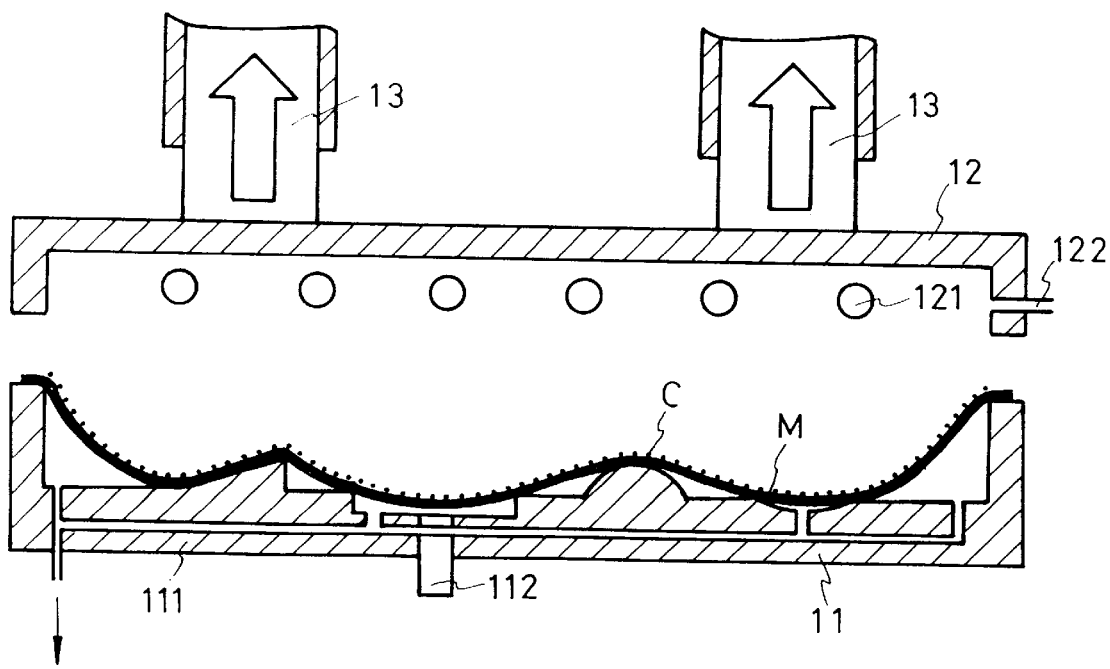
Figure 3B:
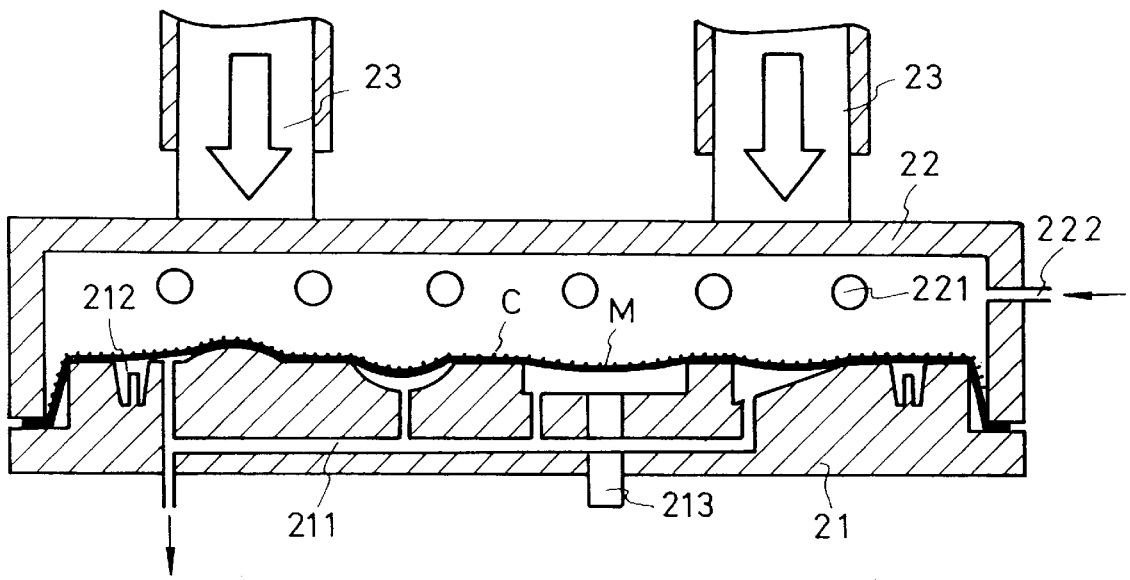

Then, referring to FIG. 4A, the first half mold (11) covered with the initially superplastically formed foil (M) is removed from the heating mold (12). Then, referring to FIG. 5A, a second half mold (15) which is attached to a nozzle (14) of an injection machine (not shown) is covered onto the first half mold (11) covered with the initially superplastically formed foil (M).

Figure 5A:
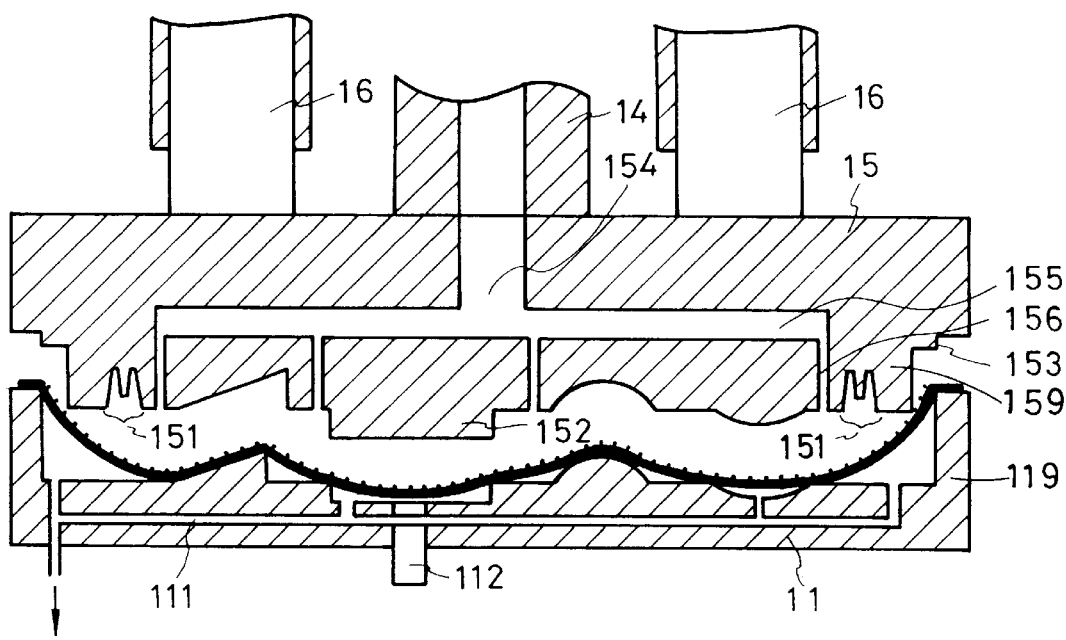

As shown in FIG. 5A, the first half mold (11) is a female mold, the second half mold (15) is a male mold. That is to say, the outer rim (119) of the first half mold (11) can surround the protrusion (159) provided near the end of the second half mold (15). Thus, the superplastic alloy foil formed will have an inner surface facing upwardly. In addition, the second half mold (15) is provided with at least one recess (151) for forming bolt holes and at least one punching device (152).

Figure 6A:
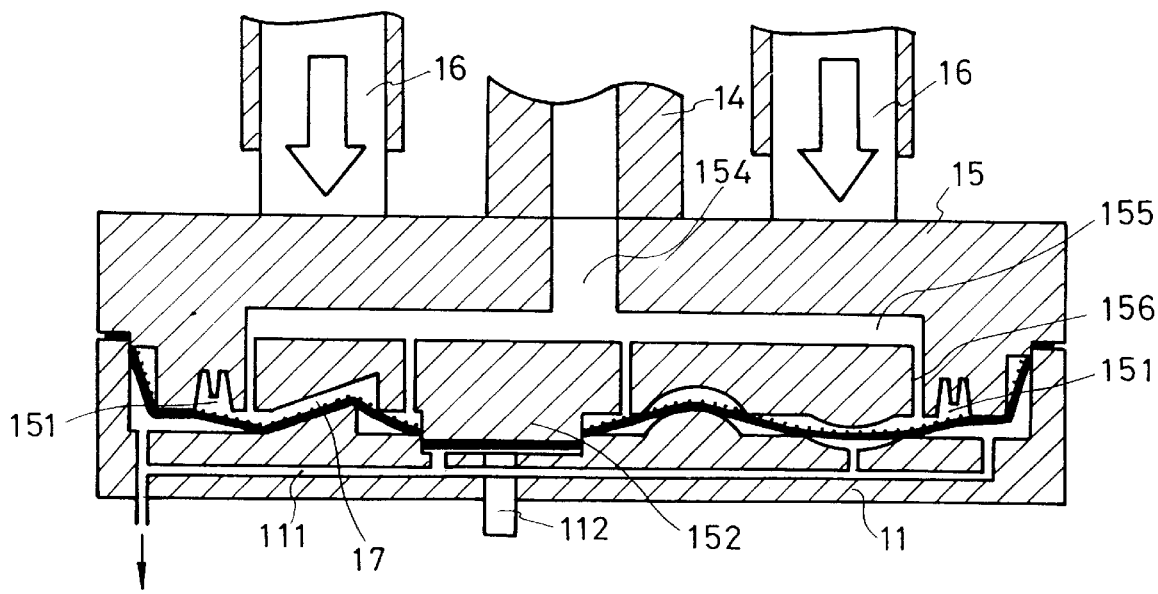

Then, referring to FIG. 6A, the two half molds (11 and 15) are closed by using a second oil pressure rod (16). Thus, the superplastic alloy foil can be further deformed according to both the shape of the first half mold (11) and the second half mold (15). In addition, during the mold closing step, structures including open windows, open bores, and open slots to be formed on the outer shell product can be formed by punching the superplastic alloy foil out with punching devices (152) provided on the second half mold (15). Also, during the mold closing step, the side material of the superplastic alloy foil can be cut by using the edges or side flanges (153) of the second half mold (15).

When the mold closing is completed, a space between the adhesive-coated side of the superplastic alloy foil (M) and the second half mold (15) should be maintained to form a mold cavity (17), in which the subsequently injected softened plastic can be received. The width of the mold cavity is approximately equal to the thickness of the plastic outer shell product to be formed.

Figure 7A:
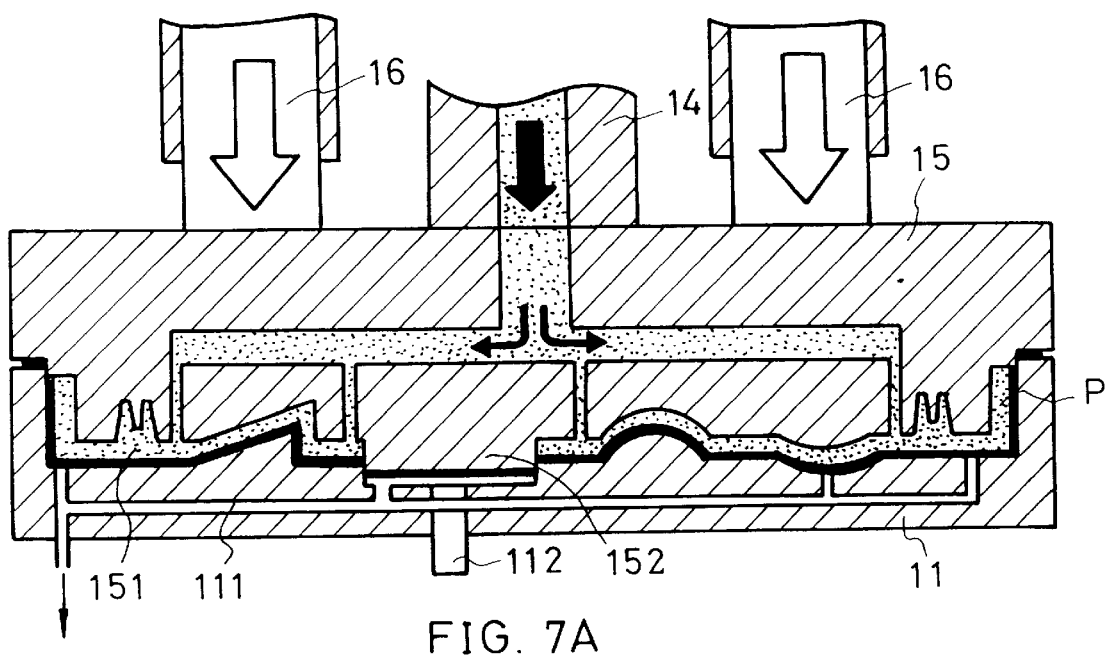

Next, referring to FIGS. 6A and 7A, softened plastic is introduced into the mold cavity (17) via the nozzle (14), a sprue (154), a runner (155) and a gate (156) of the second half mold (154), in order to make softened plastic (P) adhere on the adhesive-coated side of the superplastic alloy foil (M). At that time, the superplastic alloy foil (M) can be completely formed by the residual temperature of the softened plastic and the injection pressure. Therefore, the superplastic alloy foil can completely copy the intricate shape of the first half mold (11). Also, a bolt hole (71) can be formed on the softened plastic (P) according to the shape of the recess (151) provided on the second half mold (15).

Figure 8A:
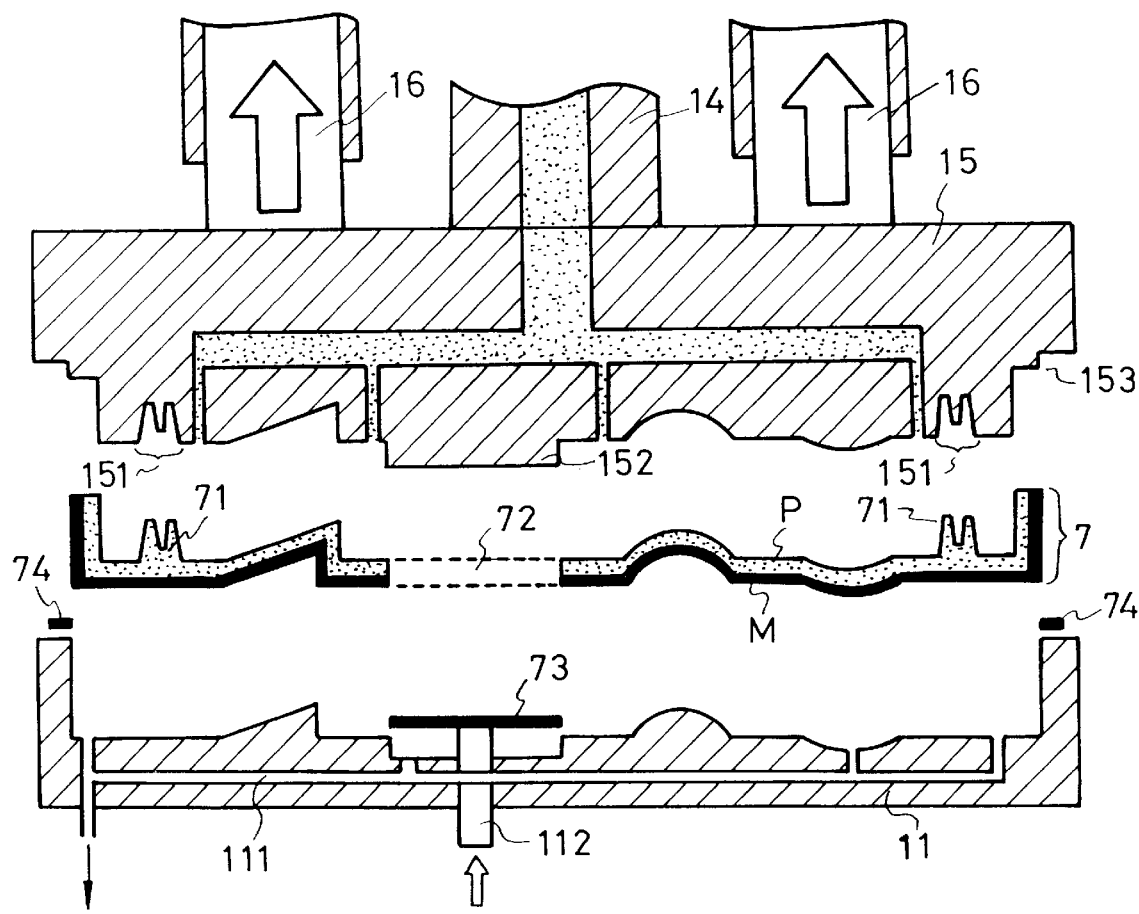

Finally, referring to FIG. 8A, the two half molds are opened to obtain a plastic outer shell product (7) cladded with a metallic foil as an outer wall. That is, the plastic outer shell product (7) has an inner wall made of plastic and an outer wall made of superplastic alloy. The inner wall of the product has at least one bolt hole (71) and at least one open window, open slot or open bore (72).

During the mold opening step of FIG. 8A, the punched-out portion (73) of the superplastic alloy foil punched out by the punching device (152) can be knocked out by a knock out pin (112) provided on the first half mold (11). In addition, side materials (74) of the superplastic alloy foil cut out by using the edges or side flanges (153) of the second half mold (15) during the mold closing step of FIG. 6A can also be moved during this mold opening step of FIG. 8A.

Figure 1B:
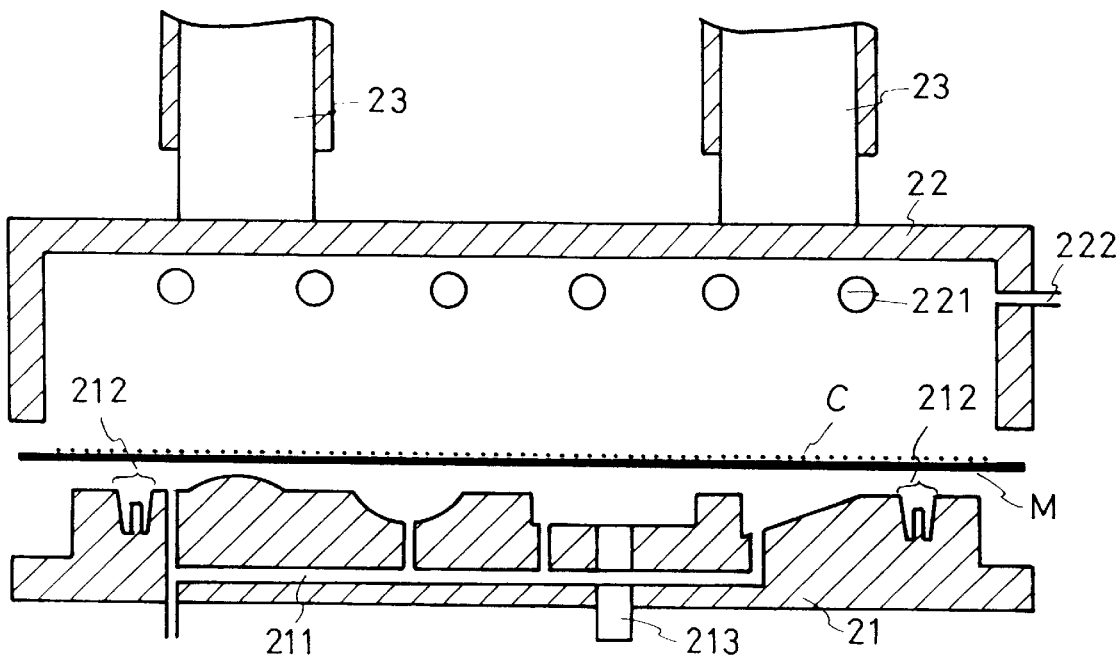

FIGS. 1B to 8B show the process flow for manufacturing a plastic outer shell product cladded with a superplastic alloy inner wall according to the second preferred embodiment of the present invention. Referring to FIG. 1, one side of a superplastic alloy foil (M) is coated with a layer of an adhesive (C) (either a coupling agent or a hot melt adhesive). Then, the adhesive-coated superplastic alloy foil is placed in a first half mold (21), with the coated side facing upwardly and the non-coated side contacting the first half mold (21). A heating mold (22) provided with a heater (221) is placed on the first half mold (21). The temperature of the heating mold is set according to Table 3 which outlines the suitable superplastic forming temperatures for various superplastic alloys. Infrared is a preferable heating source because of its high heating rate, but other heating sources can also be used.

Figure 2B:
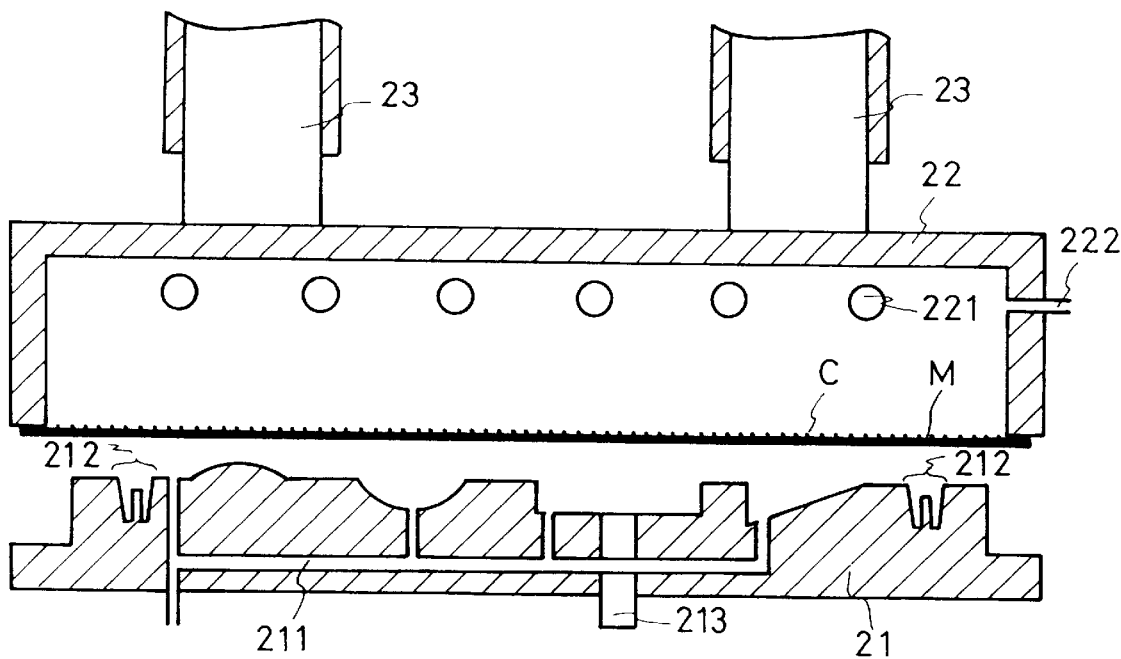
Figure 3A:
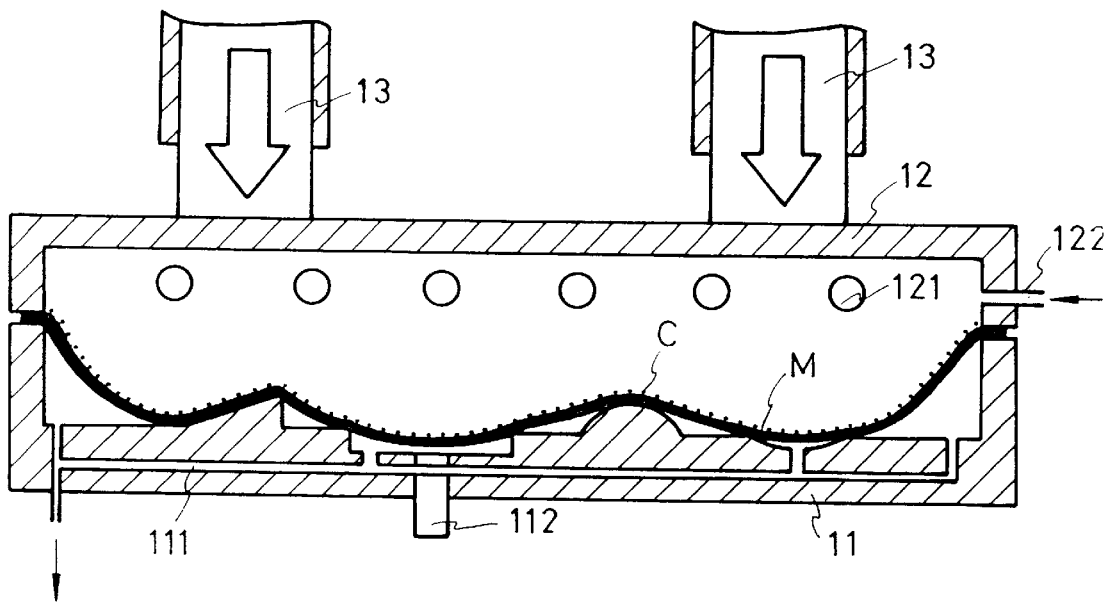

Then, referring to FIG. 2B, the adhesive-coated superplastic alloy foil (M) is fixed between the first half mold (21) and the heating mold (22) by using a first oil pressure rod (23). Then, referring to FIG. 3B, the space between the superplastic alloy foil (M) and the first half mold (21) is evacuated via a vent line (211) provided on the bottom of the first half mold (21), thus providing a negative pressure of about 0.05 to 1.00 kg/mm². In order to better deform the superplastic alloy foil (M), gas can be blown into the space between the superplastic alloy foil (M) and the heating mold (22) via a gas inlet (222) at the same time of evacuating, thus providing a positive pressure of about 0.05 to 1.00 kg/mm². By means of the above evacuation and blowing of gas, the superplastic alloy foil (M) can be initially superplastically formed. At this time, the superplastic alloy is only deformed into a general shape, while the finally desired shape has not been achieved.

Figure 4B:
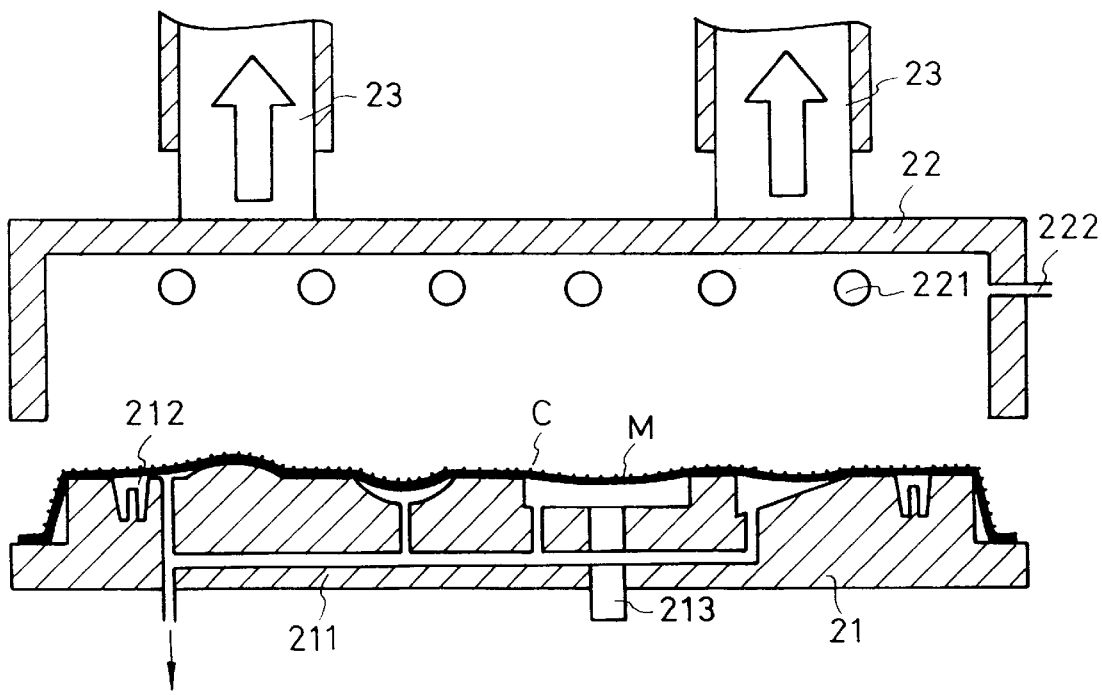

Then, referring to FIG. 4B, the first half mold (21) covered with the initially superplastically formed foil (M) is removed from the heating mold (22). Then, referring to FIG. 5B, a second half mold (25) which is attached to an nozzle (24) of an injection machine (not shown) is covered onto the first half mold (21) covered with the initially superplastically formed foil (M).

Figure 5B:
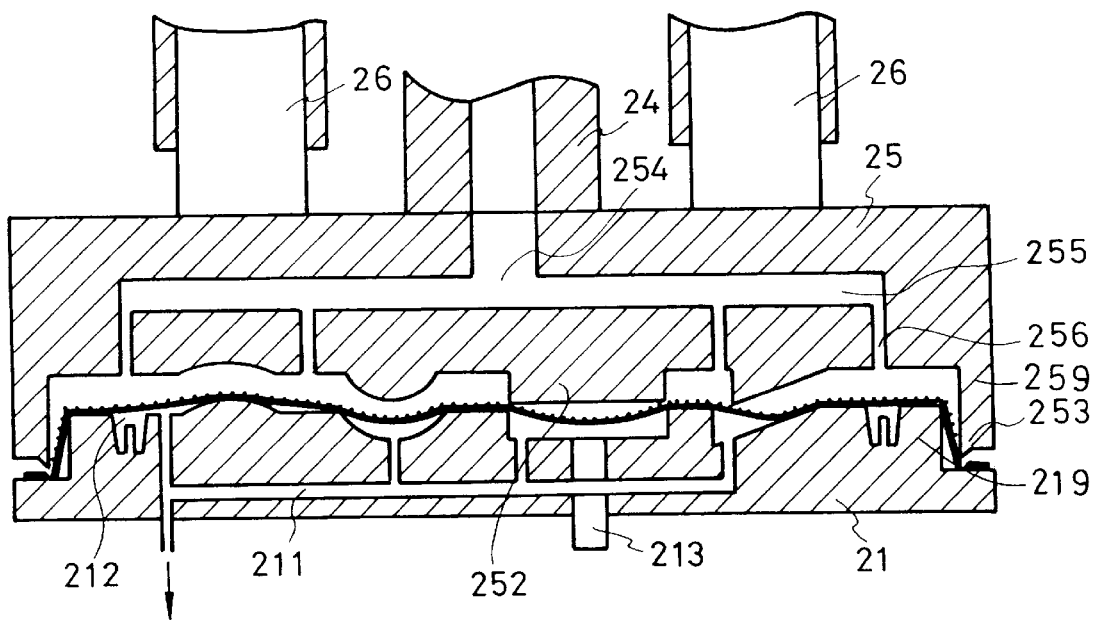

As shown in FIG. 5B, the first half mold (21) is a male mold, the second half mold (25) is a female mold. That is to say, the outer rim (259) of the second half mold (25) can surround the protrusion (219) provided near the end of the first half mold (21). Thus, the superplastic alloy foil formed will have an inner surface facing downwardly. In addition, the first half mold (21) is provided with at least one recess (212) for forming bolt holes, and the second half mold (25) is provided with at least one punching device (252).

Figure 6B:
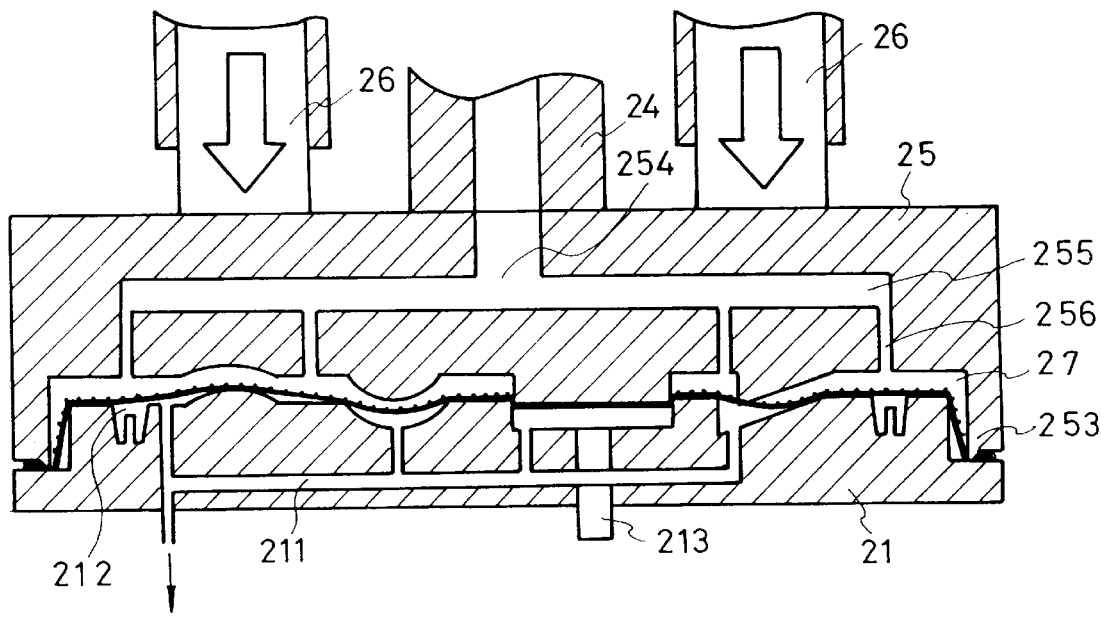

Then, referring to FIG. 6B, the two half molds (21 and 25) are closed by using a second oil pressure rod (26). Thus, the superplastic alloy foil can be further deformed according to both the shape of the first half mold (21) and the second half mold (25). In addition, during the mold closing step, structures including open windows, open bores, and open slots to be formed on the outer shell product can be formed by punching the superplastic alloy foil out with punching devices (252) provided on the second half mold (25). Also, during the mold closing step, the side material of the superplastic alloy foil can be cut by using the edges or side flanges (253) of the second half mold (25).

When the mold closing is completed, a space between the adhesive-coated side of the superplastic alloy foil (M) and the second half mold (25) should be maintained to form a mold cavity (27), in which the subsequently injected softened plastic can be received. The width of the mold cavity is approximately equal to the thickness of the plastic outer shell product to be formed.

Next, referring to FIG. 7B1 or 7B2, softened plastic is introduced into the mold cavity (27) via the nozzle (24), a sprue (254), a runner (255) and a gate (256) of the second half mold (254), in order to make softened plastic (P) adhere on the adhesive-coated side of the superplastic alloy foil (M). At that time, the superplastic alloy foil (M) can be completely formed by the residual temperature of the softened plastic and the injection pressure. Therefore, the superplastic alloy foil can completely copy the intricate shape of the first half mold (21). Also, a bolt hole (81 or 91) can be formed on the softened plastic (P) according to the shape of the recess (212) provided on the first half mold (21). By means of controlling the conditions, the softened plastic injected can be controlled to punch through or not punch through the superplastic alloy foil adhered on the recess (212).

FIG. 7B1 shows the situation in which the softened plastic injected does not punch through the superplastic alloy foil adhered on the recess (212). Therefore, after the molds are opened as shown in FIG. 8B1, a plastic outer shell product (8) cladded with a metallic foil as an inner wall can be obtained. That is, the plastic outer shell product (8) has an outer wall made of plastic (P) and an inner wall made of superplastic alloy (M). The inner wall of the product has at least one bolt hole (81) and at least one open window, open slot or open bore (82). It should be noted that the bolt hole (81) is still completely cladded with superplastic alloy.

FIG. 7B2 shows the situation in which the softened plastic injected does punch through the superplastic alloy foil adhered on the recess (212). Therefore, after the molds are opened as shown in FIG. 8B2, a plastic outer shell product (9) cladded with a metallic foil as an inner wall can be obtained. That is, the plastic outer shell product (9) has an outer wall made of plastic (P) and an inner wall made of superplastic alloy (M). The inner wall of the product has at least one bolt hole (91) and at least one open window, open slot or open bore (92). It should be noted that part of the bolt hole (91) is not cladded with superplastic alloy.

During the mold opening step of FIG. 8B1 or 8B2, the punched-out portion (83 or 93) of the superplastic alloy foil punched out by the punching device (252) can be knocked out by a knock out pin (213) provided on the first half mold (21). In addition, side materials (84 or 94) of the superplastic alloy foil cut out by using the edges or side flanges (253) of the second half mold (25) during the mold closing step of FIG. 6B can also be moved during this mold opening step of FIG. 8B1 or 8B2.

EXAMPLE 1

The process according to FIGS. 1A to 8A was conducted to manufacture a plastic outer shell product cladded with superplastic alloy as the outer wall. A Zn-22 Al superplastic alloy foil of 0.1 mm thickness was sprayed with a thin layer of polyvinyl acetate. Then, the alloy foil was fixed on a female mold. The foil was heated at about 230° C. with infrared rays and was evacuated from the bottom of the female mold to about $10^{-3}$ Torr. Thus, a negative pressure was provided to allow the Zn-22 Al alloy to initially superplastically form according to the shape of the female mold.

Then, the female mold together with the alloy foil covered thereon were moved apart. A male mold corresponding to the female mold and attached to a nozzle of an injection machine was covered onto the female mold. The two molds were closed to form a mold cavity of about 2 mm width.

Then, softened ABS+20% PC was injected into the mold cavity, in which the nozzle temperature was 250° C., injection pressure was 1.0 kg/mm$^2$, and the mold pressure was 0.3 kg/mm$^2$. After about 30 seconds, the molds were opened and a 2 mm ABS+20% PC plastic outer shell product cladded with a 0.05 mm Zn-22 Al alloy foil as an outer wall was produced. The shielding effectiveness of the work piece in the frequency ranging from 300 MHz to 1500 MHz according to the ASTM-D4935-89 coaxial transmission line test method was between 80 dB to 110 dB.

EXAMPLE 2

The process according to FIGS. 1B to 8B1 was conducted to manufacture a plastic outer shell product cladded with superplastic alloy as the inner wall. A Zn-22 Al superplastic alloy foil of 0.1 mm thickness was sprayed with a thin layer of polyvinyl acetate. Then, the alloy foil was fixed on a male mold. The foil was heated at about 230° C. with infrared rays and was evacuated from the bottom of the male mold to about $10^{-3}$ Torr. Thus, a negative pressure was provided to allow the Zn-22 Al alloy to initially superplastically form according to the shape of the male mold.

Then, the male mold together with the alloy foil covered thereon were moved apart. A female mold corresponding to the male mold and attached to an nozzle of a injection machine was covered onto the male mold. The two molds were closed to form a mold cavity of about 2 mm width.

TABLE 3

Conditions Suitable for the Superplastic Alloys of the Present Invention

| Suitable Conditions | Alloy | | | | | | |
|---|---|---|---|---|---|---|---|
| | Zn-22 Al | Zn-0.1 Ni-0.04 Mg | Sn-9.8 Zn | Sn-38 Pb | Mg-33 Al | Mg-6 Zn-0.5 Zr (Zk60A) | Mg-6 Al-1 Zn (Az61A) |
| Plastic | ABS, PPO PS, ABS/PC | ABS, PPO, PS, ABS/PC | ABS, PS | ABS, PS | PPO, ABS/PC | PPO, ABS/PC | PPO, ABS/PC |
| Forming Temp (° C.) | 180~250 | 180~250 | 156~180 | 150~170 | 300~310 | 300~310 | 300~310 |
| Forming Pressure (kg/mm$^2$) | 0.07~0.4 | 0.1~0.7 | 0.05~0.2 | 0.05~0.2 | 0.1~0.7 | 0.2~1.0 | 0.2~1.0 |

The following examples are intended to illustrate the process and the advantages of the present invention more fully without limiting its scope, since numerous modifications and variations will be apparent to those skilled in the art.

Then, softened ABS+20% PC was injected into the mold cavity, in which the nozzle temperature was 250° C., injection pressure was 1.0 kg/mm$^2$, and the mold pressure was 0.3 kg/mm$^2$. After about 30 seconds, the molds were opened and a 2 mm ABS+20% PC plastic outer shell product cladded with a 0.05 mm Zn-22 Al alloy foil as an inner wall was produced. The shielding effectiveness of the work piece in the frequency ranging from 300 MHz to 1500 MHz according to the ASTM-D4935-89 coaxial transmission line test method was between 80 dB to 110 dB.

The advantages of the present invention can be summarized as follows:

1. Since superplastic has the advantages of large deformation and intricate forming, which are also the advantages of plastic molding, the metallic foil cladded plastic outer shell product of the present invention can have as intricate a shape as an ordinary plastic product. In comparison, a conventional metallic shield can not achieve such an intricate shape.
2. Since one side of the metallic plastic product of the present invention is still a complete plastic layer, the product can exhibit the color and pleasing appearance of the plastic.
3. The cladded metallic foil cladded is very thin (even below 0.05 mm). Thus, the final metallic plastic product is still as light weight and thin as an ordinary plastic product.
4. Since the cladded metallic foil is a continuous and complete layer (solid), the obtained metallic plastic product can achieve the same shielding effectiveness (higher than 60 dB) of a conventional metallic shield.
5. Compared with the conventional process of metallizing plating on plastics, the present invention has a low production cost, an absence of environmental pollution problems, and the metallic layer does not easily peel off. The waste products can easily be separated into metallic foil and plastic, and are easily collected.
6. Compared with the process of manufacturing conductive component-filled plastic composite, the present invention not only achieves a high shielding effectiveness (higher than 60 dB), but also the cladded metallic foil provides a reinforcing action to the plastic layer; thus, the mechanical properties of the final metallized plastic product will not be adversely affected. In addition, all the inferior phenomena (including lag, segregation, orientional, and floating) that occur in the production of the conventional conductive component-filled plastic composite can be effectively solved. Also, the wear of the mold, screws, and compressing cylinder walls of the injection machine can be prevented. In addition, the wave leak phenomenon occurring in the plastic outer shell product with multiple sheet structure can be prevented in the present invention.
7. Compared with the compression cast or injection molded magnesium alloy outer shell, the cost of the process of the present invention is much cheaper (approximately 20% to 30% of the cost for the magnesium alloy outer shell). Tables 4 and 5 show the comparison between the shielding plastic outer shell product of the present invention and those manufactured from conventional methods in terms of shielding effectiveness and cost, respectively.
8. By adjusting the shape of the half molds, the superplastic alloy foil cladded on the plastic outer shell can be made either as the outer wall or inner wall, as required. Therefore, the plastic outer shell cladded with superplastic alloy foil as the outer wall has a shiny appearance with metallic luster. The plastic outer shell cladded with superplastic alloy foil as the inner wall has an appearance with soft color, and the coloring of the plastic outer wall can be altered very easily. The present invention is the first time a process which can provide a metallic plastic outer shell with such a variety choices regarding appearance has been developed. In addition, average processing cycle for one outer shell product is only 2 minutes, which is desirably fast.

TABLE 4

Comparison between the shielding plastic outer shell product of the present invention and those manufactured from conventional methods on shielding effectiveness

| Shielding Outer Shell products | Conductive Layer Thickness ($\mu$m) | Resistivity (ohm/sq.) | Shielding Effectiveness (dB) |
|---|---|---|---|
| Zinc Arc Spray/Plastics | 12–25 | 0.03 | 50–60 |
| Zinc Flame Spray/Plastics | 25 | 4.0 | 50–60 |
| Nickel-Acrylic Paint/Plastics | 50 | 0.5–2.0 | 30–75 |
| Silver-Acrylic Paint/Plastics | 25 | 0.04–0.1 | 60–70 |
| Copper-Acrylic Paint/Plastics | 25 | 0.5 | 60–70 |
| Graphite-based Paint/Plastics | 25 | 7.5–20 | 20–40 |
| Cathode Sputtering Plastics | 0.75 | 2.5 | 76–90 |
| Electrolating Plastics | 0.75 | 0.1 | 85 |
| Electroless plating (Cu/Ni) Plastics | 1.25 | 0.03 | 60–70 |
| Silver Reduction/Plastics | 1.25 | 0.5 | 70–90 |
| Vacuum Metallizing Plastics | 1.25 | 5–10 | 50–70 |
| Ion Plating Plastics | 1.0 | 0.01 | 50 |
| Conductive Component-filled Plastic Composite* | 1000–3000 | 75–100 | <50 |
| Mg Alloy (AZ91D) Outer Shell | 800–1500 | 0.04 | 80–110 |
| Plastic Outer Shell Cladded with Zn-22 Al Alloy Foil of the Present Invention | 50–100 | 0.03 | 80–110 |

*Forty percent carbon-filled nylon 6/6 . manufactured from LNP Corp., Malver. PA.

TABLE 5

Comparison between the shielding plastic outer shell product of the present
invention and those manufactured from conventional methods on cost

| Shielding Plastic Outer Shell Products | Conductive Layer Thickness ($\mu$m) | Cost (USD)* |
|---|---|---|
| Ni Containing Coating Plastics | 50 | 15 |
| Cu Containing Coating Plastics | 50 | 13 |
| Chemical Plating (both sides) Plastics | 1.3 | 30 |
| Chemical Plating (one side) Plastics | 2.3 | 45 |
| Zn Spray/Plastics | 80 | 15 |
| Al Vacuum Deposition/Plastics | 2.5 | 22 |
| Cu Foil/Plastics | 35 | 6 |
| Stainless Steel Fiber Filled Plastics | 2000–3000 | 45 |
| Mg Alloy (AZ91D) Outer Shell | 800–500 | 75 |
| Plastic Outer Shell Cladded with Zn-22 Al Alloy Foil of the Present Invention | 50–100 | 15 |

*The cost is based on one set of outer shells of a notebook computer, including material cost and processing cost

What is claimed is:

1. A process for manufacturing an electromagnetic interference shielding metallic foil cladded plastic outer shell product, comprising the following sequential steps of:

(a) coating a first side of a superplastic alloy foil with an adhesive;

(b) placing the adhesive-coated superplastic alloy foil in a first half mold with a second side of the foil contacting the first half mold, and heating and applying flow stress to the superplastic alloy foil to allow the foil to superplastically form into a predetermined shape and to allow the foil to cover on the first half mold, whereby the superplastic alloy is initially superplastically formed;

(c) covering a second half mold attached to a nozzle of an injection machine onto the first half mold covered with the foil, and closing the two half molds to further deform the superplastic alloy foil, a mold cavity being formed between the adhesive-coated side of the superplastic alloy foil and the second half mold;

(d) introducing softened plastic from the injection machine via the nozzle to the mold cavity, such that the superplastic alloy foil covered on the first half mold is completely formed and the softened plastic adheres on the adhesive-coated side of the superplastic alloy foil to form an electromagnetic interference shielding metallic foil cladded plastic outer shell product; and (e) removing the plastic outer shell product from the mold.

2. The process as claimed in claim 1, wherein the superplastic alloy is selected from the group consisting of zinc alloys, aluminum alloys, magnesium alloys, titanium alloys, tin alloys, duplex stainless steels, and super alloys.

3. The process as claimed in claim 1, wherein the adhesive is a coupling agent or a hot melt adhesive.

4. The process as claimed in claim 3, wherein the coupling agent is selected from the group consisting of silanes, titantates, zirconates and aluminates.

5. The process as claimed in claim 3, wherein the hot melt adhesive is selected from the group consisting of polyvinyl acetate, ethylene vinyl acetate copolymers, rosin and Terpene resin.

6. The process as claimed in claim 1, wherein in step (b), the applying of flow stress to the superplastic alloy foil is conducted by evacuating a space between the foil and first half mold, by blowing gas into a space between the foil and the second half mold, or by knocking another mold onto the superplastic alloy foil.

7. The process as claimed in claim 1, wherein the plastic is a thermoplastic.

8. The process as claimed in claim 7, wherein the plastic is selected from the group consisting of acrylonitrile-butadiene-styrene (ABS), polystyrene (PS), polyphenylene oxide (PPO) and acrylonitrile-butadiene-styrene/polycarbonate (ABS/PC).

9. The process as claimed in claim 1, wherein the first half mold is a female mold and the second half mold is a male mold, such that the plastic outer shell product produced has an inner wall made of plastic and an outer wall made of superplastic alloy.

10. The process as claimed in claim 9, wherein the second half mold is provided with at least one recess.

11. The process as claimed in claim 10, further comprising, during step (d), forming at least one plastic bolt hole on the inner wall of the plastic outer shell according to the shape of the recess.

12. The process as claimed in claim 1, wherein the first half mold is a male mold and the second half mold is a female mold, such that the plastic outer shell product produced has an outer wall made of plastic and an inner wall made of superplastic alloy.

13. The process as claimed in claim 12, wherein the first half mold is provided with at least one recess.

14. The process as claimed in claim 13, further comprising, during step (d), forming at least one superplastic alloy bolt hole on the inner wall of the plastic outer shell according to the shape of the recess.

15. The process as claimed in claim 13, further comprising, during step (d), punching through the superplastic alloy covered on the recess with the softened plastic to form at least one plastic bolt hole on the inner wall of the plastic outer shell according to the shape of the recess.

16. The process as claimed in claim 1, further comprising, when step (c) is conducted, punching a predetermined portion of the superplastic alloy foil out by at least one punching device provided on the second half mold to form at least one open window, open slot or open bore on the foil.

* * * * *